(12) United States Patent
Hung et al.

(10) Patent No.: US 12,144,138 B2
(45) Date of Patent: Nov. 12, 2024

(54) HANDLE RELEASE FOR LOCKING AND UNLOCKING A RISER CAGE TO A STABILIZING FEATURE OF A COMPUTING DEVICE

(71) Applicant: Dell Products L.P., Round Rock, TX (US)

(72) Inventors: Hsiang-Yin Hung, Taipei (TW); Chien-Hung Chou, Taipei (TW); Hsu-Chu Wang, Taipei (TW); Hung-Wen Wu, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 307 days.

(21) Appl. No.: 17/507,332

(22) Filed: Oct. 21, 2021

(65) Prior Publication Data

US 2023/0129215 A1    Apr. 27, 2023

(51) Int. Cl.
*H05K 7/14* (2006.01)
*H05K 7/16* (2006.01)

(52) U.S. Cl.
CPC ............. *H05K 7/1417* (2013.01); *H05K 7/16* (2013.01)

(58) Field of Classification Search
CPC ........ H05K 7/1417; H05K 7/16; G06F 1/187; G06F 1/188; G06F 1/181; G06F 1/183
See application file for complete search history.

(56) References Cited

U.S. PATENT DOCUMENTS

| | | | | |
|---|---|---|---|---|
| 6,252,514 B1 * | 6/2001 | Nolan | ................ | G11B 33/128 361/170 |
| 10,251,300 B1 * | 4/2019 | Mao | ................ | H05K 7/1487 |
| 10,863,647 B1 * | 12/2020 | Escamilla | ................ | H05K 5/023 |
| 10,939,573 B1 * | 3/2021 | Liao | ................ | H01R 13/62983 |
| 11,439,033 B2 * | 9/2022 | Mao | ................ | H05K 7/1457 |
| 11,665,848 B2 * | 5/2023 | Wang | ................ | H05K 7/1489 312/330.1 |
| 11,729,935 B2 * | 8/2023 | Tsorng | ................ | H05K 7/1405 361/759 |

(Continued)

FOREIGN PATENT DOCUMENTS

| | | | | |
|---|---|---|---|---|
| TW | 201530539 A | * | 8/2015 | ............ G06F 1/187 |
| TW | 202015041 A | * | 4/2020 | |
| TW | M601955 U | * | 9/2020 | |

OTHER PUBLICATIONS

Dell EMC, "Dell EMC PowerEdge R940", Installation and Service Manual, 2018.

(Continued)

*Primary Examiner* — Hanh V Tran
(74) *Attorney, Agent, or Firm* — Chamberlain, Hrdlicka, White, Williams & Aughtry; Aly Dossa

(57) ABSTRACT

Systems for unlocking and locking a riser cage to a computing device are described herein. Such systems may include: a riser cage in a computing device; an axis member coupled to a first side of the riser cage and adapted to rotate about an axis; a handle coupled to the axis member and adapted to rotate the axis member about the axis; a cam, coupled to the axis member, and adapted to rotate about the axis when the axis member rotates; and a lever coupled to a second side of the riser cage and adapted to rotate about a pivot point when the cam rotates, wherein the lever engages with a stabilizing feature when the handle is in a first handle position.

10 Claims, 7 Drawing Sheets

(56) References Cited

U.S. PATENT DOCUMENTS

| | | | |
|---|---|---|---|
| 11,744,032 B2* | 8/2023 | Yu | H05K 7/1429 |
| | | | 361/679.01 |
| 2003/0223201 A1* | 12/2003 | Son | G06F 1/184 |
| | | | 361/752 |
| 2006/0012965 A1* | 1/2006 | Beall | H05K 7/1409 |
| | | | 361/726 |
| 2018/0160563 A1* | 6/2018 | Hung | H05K 7/1409 |
| 2019/0057725 A1* | 2/2019 | Yang | G06F 1/187 |
| 2021/0045261 A1* | 2/2021 | Huang | H05K 7/1489 |
| 2021/0068317 A1* | 3/2021 | Wang | F16M 13/02 |
| 2021/0227715 A1* | 7/2021 | Mao | H05K 7/1492 |
| 2022/0386497 A1* | 12/2022 | Wang | H05K 7/1489 |

OTHER PUBLICATIONS

Dell Technologies, "Dell EMC PowerEdge R7525", Installation and Service Manual, Mar. 2021.

Dell Technologies, "Dell EMC PowerEdge R940xa", Technical Guide, Apr. 2021.

* cited by examiner

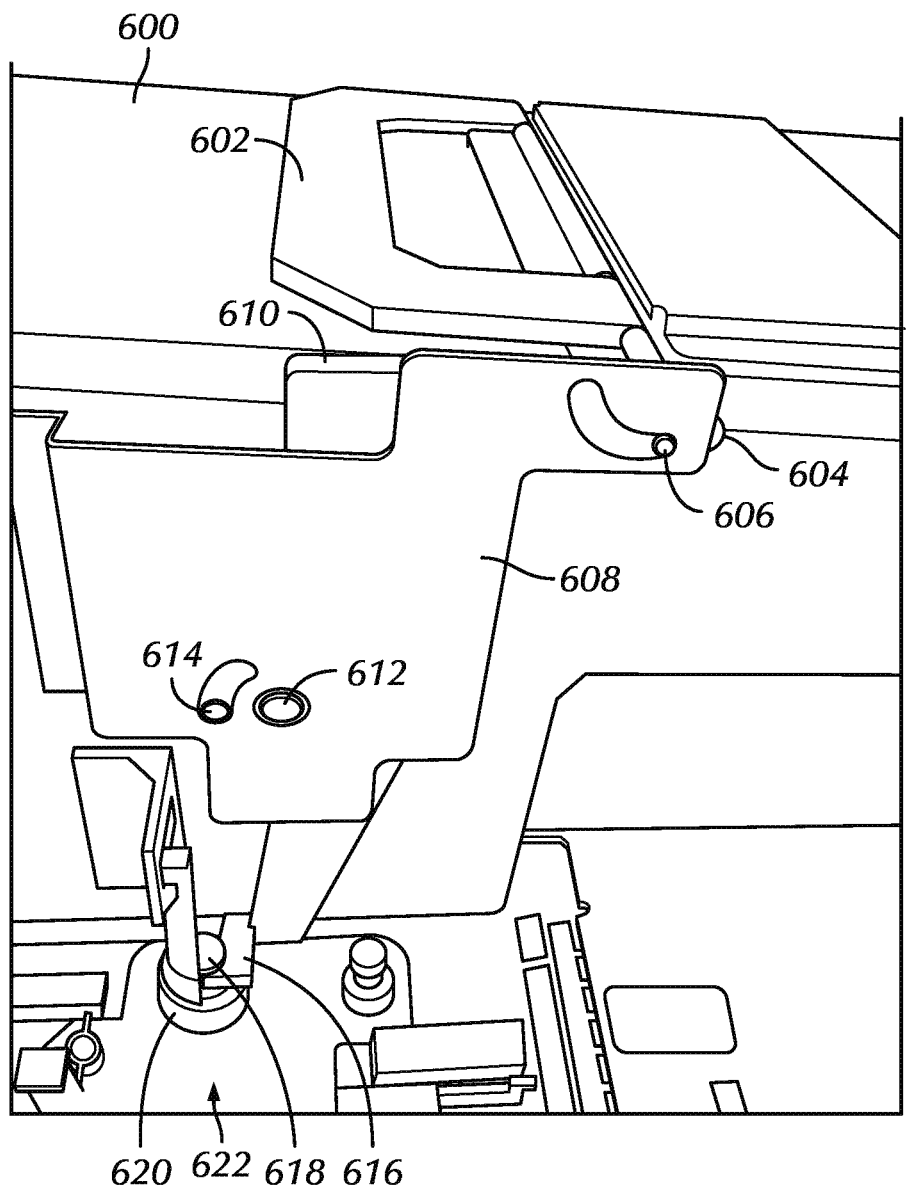
FIG. 6.1

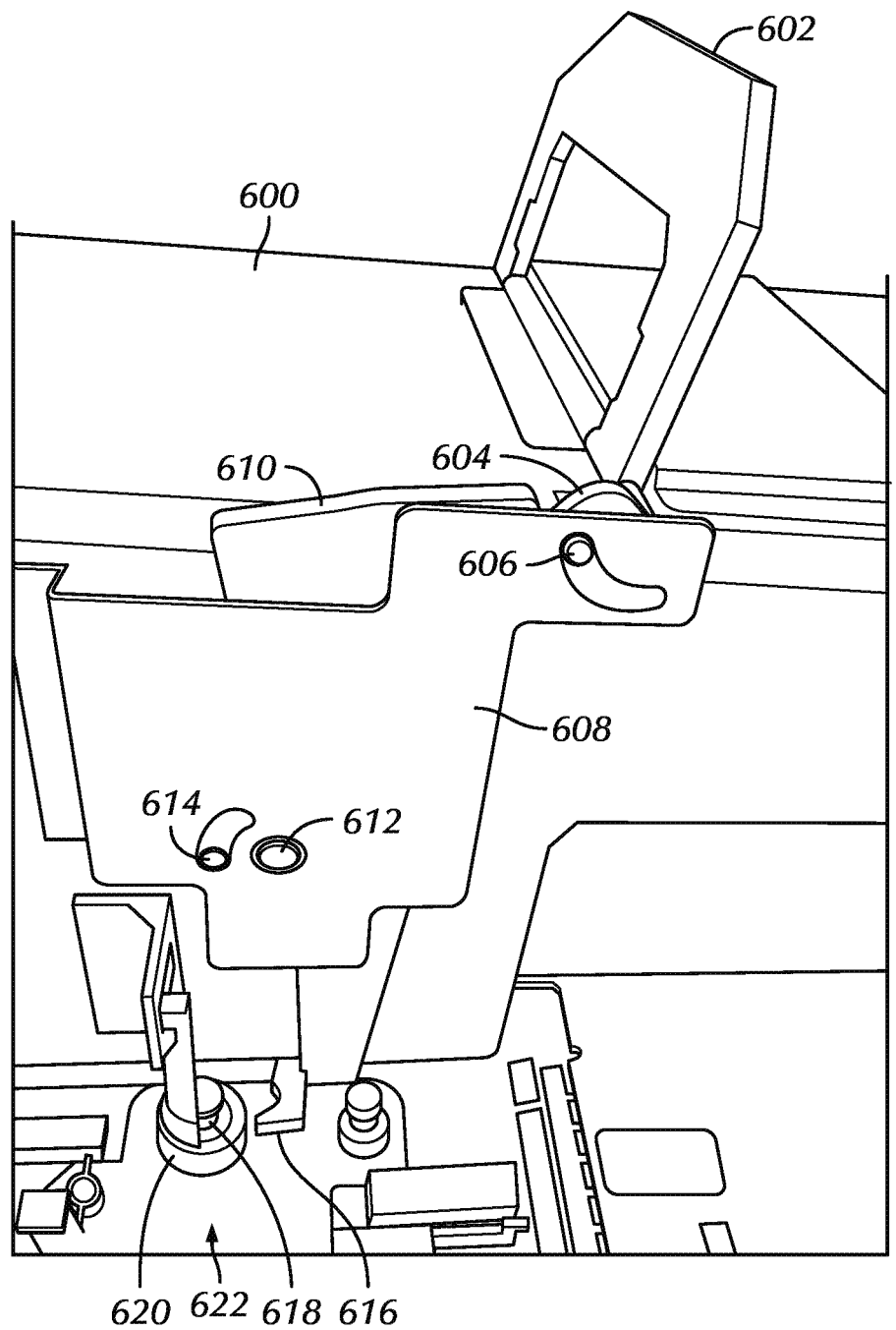
FIG. 6.2

HANDLE RELEASE FOR LOCKING AND UNLOCKING A RISER CAGE TO A STABILIZING FEATURE OF A COMPUTING DEVICE

BACKGROUND

Computing devices may include one or more components. Such components may be coupled to the computing device via a connection cable. The components may be removed from the computing device to replace the components or to perform maintenance on the components. To address the need to remove components from a computing device, the components may be included in a riser cage. The riser cage may be locked in the computing device to prevent unwanted movement of the components included in the riser cage. The riser cage may require a release to unlock the riser cage from the computing device to enable the riser cage to be completely removed from the computing device so that users may replace and/or perform maintenance on the components included in the riser cage. However, due to the configuration of the release, the confined nature of the computing device, the size and weight of the riser cage, and the short length of the connection cable, it may be difficult for a single user to engage the release, lift the riser cage, and unplug the connection cable from the computing device to completely remove the riser cage from the computing device.

BRIEF DESCRIPTION OF DRAWINGS

FIG. 6.1 shows a perspective view of a first example of a riser cage with a handle release connected to a computing device in accordance with one or more embodiments of the invention.

FIG. 6.2 shows a perspective view of a second example of a riser cage with a handle release connected to a computing device in accordance with one or more embodiments of the invention.

DETAILED DESCRIPTION

Figure 1:
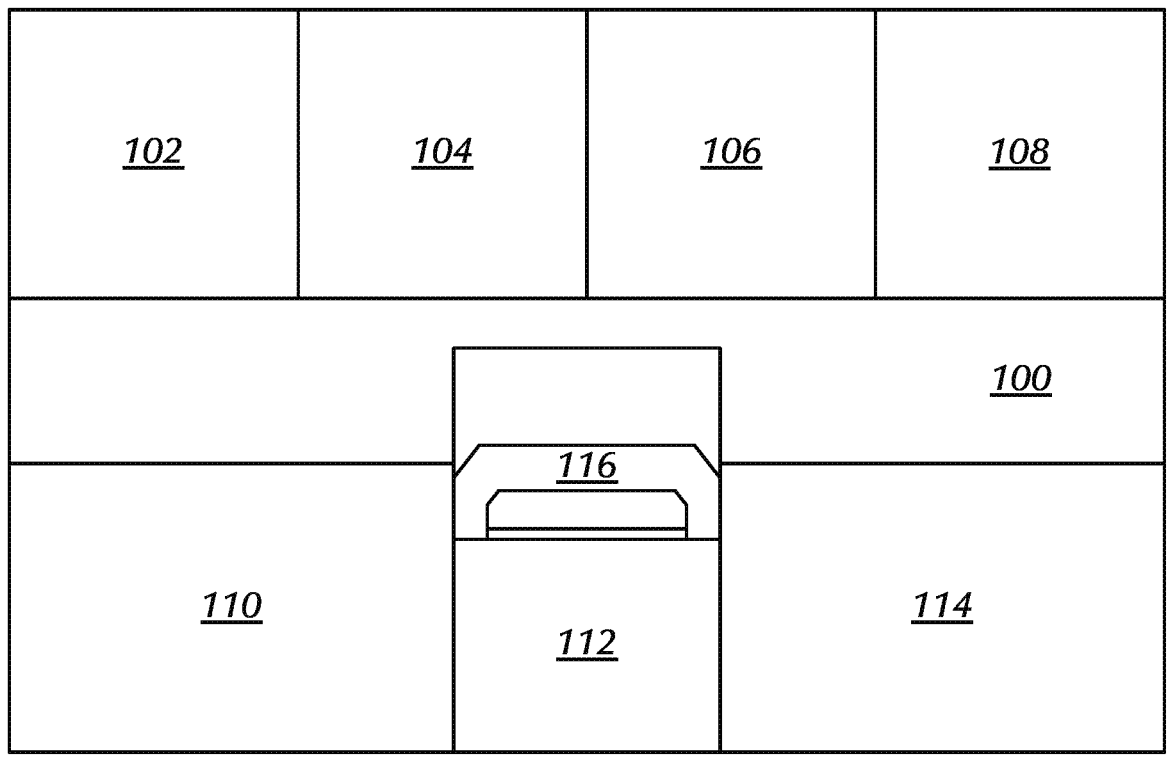
FIG. 1 shows a top view of a computing device in accordance with one or more embodiments of the invention.

Specific embodiments will now be described with reference to the accompanying figures.

In general, embodiments of the invention herein relate to systems for locking and unlocking a riser cage to a computing device. As used herein, locking the riser cage may refer to securing the riser cage to the computing device so that the riser cage and may not be removed from the computing device. When the riser cage is locked to the computing device, the riser cage may not be removed from the computing device. As used herein, unlocking the riser cage may refer to releasing the riser cage from the computing device so that the riser cage may be removed from the computing device. When the riser cage is unlocked (i.e., released), the riser cage may be removed from the computing device.

In one or more embodiments of the invention, the system includes a computing device that includes a riser cage. In one or more embodiments of the invention, the riser cage is adapted to be removed from the computing device. In one or more embodiments of the invention, the riser cage includes an axis member adapted to be coupled to a first side of the riser cage. The axis member may further be adapted to rotate about an axis.

In one or more embodiments of the invention, the system further includes a handle adapted to be coupled to the axis member. In one or more embodiments of the invention, the handle is further adapted to rotate the axis member about the axis. In one or more embodiments of the invention, the system further includes a cam that is adapted to be coupled to the axis member. In one or more embodiments of the invention, the cam is further adapted to rotate about the axis when the axis member rotates. In one or more embodiments of the invention, the system further includes a lever adapted to be coupled to a second side of the riser cage. In one or more embodiments of the invention, the lever is further adapted to rotate about a pivot point when the cam rotates. In one or more embodiments of the invention, the lever engages with a stabilizing feature coupled to the computing device when the handle is in a first handle position. When the lever engages with the stabilizing feature, the riser cage may be locked to the computing device.

In one or more embodiments of the invention, the lever is further adapted to disengage with the stabilizing feature when the handle is rotated to a second handle position. When the lever disengages with the stabilizing feature, the riser cage is unlocked and may be removed from the computing device.

In one or more embodiments of the invention, the system further includes a lever housing feature adapted to be coupled to the second side of the riser cage. In one or more embodiments of the invention, the lever housing feature is further adapted to include the pivot point about which the lever rotates. In one or more embodiments of the invention, the lever housing feature is still further adapted to include a first constraining feature and a second constraining feature.

In one or more embodiments of the invention, the first constraining feature is adapted to be coupled to the cam and constrains the rotation of the cam between a first cam position and a second cam position. Accordingly, due to the cam being coupled to the lever, the first constraining feature may also constrain the rotation of the lever between the first lever position and the second lever position. Likewise, due to the cam being indirectly coupled to the handle through the axis member, the first constraining feature may also constrain the rotation of the handle between the first handle position and the second handle position.

In one or more embodiments of the invention, when the handle is in the first handle position, the cam is in the first cam position and the lever is in the first lever position. Similarly, in one or more embodiments of the invention, when the handle is in the second handle position, the cam is in the second cam position and the lever is in the second lever position.

In one or more embodiments of the invention, the second constraining feature is adapted to be coupled to the lever. In one or more embodiments of the invention, the second constraining feature is further adapted to provide a counter force to the lever. The second constraining feature may include a torsion spring. In one or more embodiments of the invention, the counter force rotates the lever to the first lever position. Consequently, in one or more embodiments of the invention, the counter force also rotates the cam to the first cam position and the handle to the first handle position. In one or more embodiments of the invention, the lever remains in the first lever position unless a force greater than the counter force is applied to the lever by the cam. In one or more embodiments of the invention, such a force is applied as a result of rotation of the axis member when the handle moves from the first handle position to the second handle position.

In one or more embodiments of the invention, the system further includes a guiding feature adapted to be coupled to the second side of the riser cage. In one or more embodiments of the invention, the guiding feature is further adapted to position the riser cage in an orientation of the riser cage to the computing device. In one or more embodiments of the invention, the positioning the riser cage in the aforementioned orientation enables the lever to engage with the stabilizing feature.

In one or more embodiments of the invention, a user may use a single handle to rotate the handle from the first handle position to the second handle position. As a result the lever may disengage with the stabilizing feature, thereby unlocking the riser cage from the computing device. The user may use a second hand to disconnect any connection cables connecting the components included in the riser cage to the computing device. Therefore, a single user may easily unlock the riser cage from the computing device, lift the riser cage, and disconnect any connection cables connecting components included in the riser cage to the computing device.

In one or more embodiments of the invention, a user may use a single hand to hold the riser cage by the handle in the second handle position, and use another hand to connect any connection cables connecting components included in the riser cage to the computing device. The user may then place the riser cage into an orientation in which the lever can engage with the stabilizing feature. The user may finally release the handle, causing the handle to rotate from the second handle position to the first handle position. As a result, the lever may engage with the stabilizing feature and lock the riser cage to the computing device.

FIG. 1 shows a top view of a computing device in accordance with one or more embodiments of the invention. The devices/components shown in FIG. 1A and described below are each only one example of a particular device/component. One having ordinary skill in the art, and the benefit of this Detailed Description, will appreciate that the techniques described herein may apply to any number of different devices. Accordingly, embodiments described herein should not be considered limited to devices/components shown in FIG. 1A.

As shown in FIG. 1, the computing device (100) may include one or more components (e.g., 102, 104, 106, 108, 110, 114) and a riser cage (112). The computing device may include other and/or additional components without departing from the invention. Each of these components is described below.

In one or more embodiments of the invention, the computing device (100) is any device or any set of devices capable of electronically processing instructions and may include, but is not limited to, any of the following: one or more processors (e.g. components that include integrated circuitry) (not shown), memory (e.g., random access memory (RAM) (not shown)), input and output device(s) (not shown), persistent storage, one or more physical interfaces (e.g., network ports) (not shown), any number of other hardware components (not shown) and/or any combination thereof.

Examples of computing devices include, but are not limited to, a server (e.g., a blade-server in a blade-server chassis, a rack server in a rack, etc.), a desktop computer, a mobile device (e.g., laptop computer, smart phone, personal digital assistant, tablet computer and/or any other mobile computing device), a network device (e.g., switch, router, multi-layer switch, etc.) such as that described below, a virtual machine executing using underlying hardware components of a physical computing device, and/or any other type of computing device with the aforementioned requirements.

In one or more embodiments of the invention, as discussed above, one type of a computing device as described herein is a network device. In one or more embodiments of the invention, a network device is a physical device that includes and/or is operatively connected to persistent storage (not shown), memory (e.g., random access memory (RAM)) (not shown), one or more processor(s) (e.g., integrated circuits) (not shown), and at least one physical network interface (not shown). Examples of a network device include, but are not limited to, a network switch, a router, a multilayer switch, a fibre channel device, an InfiniBand® device, etc. A network device is not limited to the aforementioned specific examples.

In one or more embodiments of the invention, a network device also includes any number of additional components (not shown), such as, for example, circuit boards, network chips, field programmable gate arrays (FPGAs) (not shown), application specific integrated circuits (ASICs) (not shown), indicator lights (not shown), fans (not shown), clocks (not shown), etc. In one or more embodiments, all or any portion of such components may require at least some cooling to be provided at certain times.

As discussed above, the computing device (100) includes one or more components. The computing device may include, for example, a first component (102), a second component (104), a third component (106), a fourth component (108), a fifth component (110), and a sixth component (114). The computing device (100) may include additional or fewer components without departing from the invention. The components (102, 104, 106, 108, 110, 114) may be embodiments of the components of a computing device discussed above. The components (102, 104, 106, 108, 110, 114) may include, but not be limited to, one or more processors (e.g. components that include integrated circuitry such as central processing units (CPUs), graphics processing units (GPUs), etc.), memory (e.g., random access memory (RAM)), input and output device(s), persistent storage (e.g., hard disk drives, solid-state drives, etc.), one or more physical interfaces (e.g., network ports), circuit boards, network chips, field programmable gate arrays (FPGAs) (not shown), application specific integrated circuits (ASICs), clocks, power supplies, and any number of other hardware components (not shown) and/or any combination thereof without departing from the invention.

The components (102, 104, 106, 108, 110, 114) may include similar and/or different types of components. As an example, the first component (102) may be a power supply, the second component (104) may be a CPU, the third component (106) may be a GPU, the fourth component (108) may be RAM, the fifth component (110) may be a hard disk drive, and the sixth component (114) may also be a hard disk drive.

In one or more embodiments of the invention, all or any portion of the components of a device (e.g., a network device) may be located within an interior of the computing device (100) shown in FIG. 1. The interior of the computing device (100) may include, for example, a service chassis of a server, a case for a desktop computer, etc. In one or more embodiments, any or all such components (102, 104, 106, 108, 110, 114) may require maintenance or to be replaced. To perform maintenance and/or to replace one or more of the components (102, 104, 106, 108, 110, 114), the components (102, 104, 106, 108, 110, 114) may be removed from the computing device. The components (102, 104, 106, 108, 110, 114) may be removed from the computing device (100) for other and/or additional purposes without departing from the invention. Due the size and/or shape of the components (102, 104, 106, 108, 110, 114) and/or the computing device (100), removing the components (102, 104, 106, 108, 110, 114) may be difficult. To address, at least in part, the difficulty of removing components (102, 104, 106, 108, 110, 114) from the computing device (100), all, or a portion of, the components (102, 104, 106, 108, 110, 114) may be included in a riser cage (112).

In one or more embodiments of the invention, a riser cage (112) is a structure adapted to hold one or more components (102, 104, 106, 108, 110, 114) of the computing device (100). The riser cage (112) may further be adapted to be lifted or otherwise be removed from the computing device (100). The riser cage (112) may be lifted, for example, via a handle (116) (discussed below in FIGS. 2-6.2) coupled to one side of the riser cage (112). The riser cage (112) may be coupled to the computing device (100) when placed in the computing device (100) such that the riser cage may not excessively move or rotate (i.e., more than an inch in any direction) except in the direction in which the riser cage is removed from the computing device (100). The one or more components (102, 104, 106, 108, 110, 114) may be coupled to the structure of the riser cage (112). In one or more embodiments of the invention, the riser cage (112) includes any number of components (not shown) for providing a structure to which components (102, 104, 106, 108, 110, 114) are coupled, and to which may be coupled to the computing device (100).

In one or more embodiments of the invention, the riser cage (112) and its features (discussed below in FIGS. 2-6.2) are constructed as a single component. In other embodiments of the invention, the riser cage (112) is any number of components coupled to form the riser cage (112). The riser cage (112) may be constructed of any material (e.g., polymer, metal, etc.) or any combination of materials.

While FIG. 1 shows a configuration of components, other configurations may be used without departing from the scope of embodiments described herein. For example, the computing device (100), the components (102, 104, 106, 108, 110, 114), the riser cage (112), and the handle (116) may each be of any shape and/or size. As another example, rather than a computing device (e.g., a server), one or more riser cages may be used in any scenario where components of a device are to be removed. Accordingly, embodiments disclosed herein should not be limited to the configuration of components shown in FIG. 1.

Figure 2:
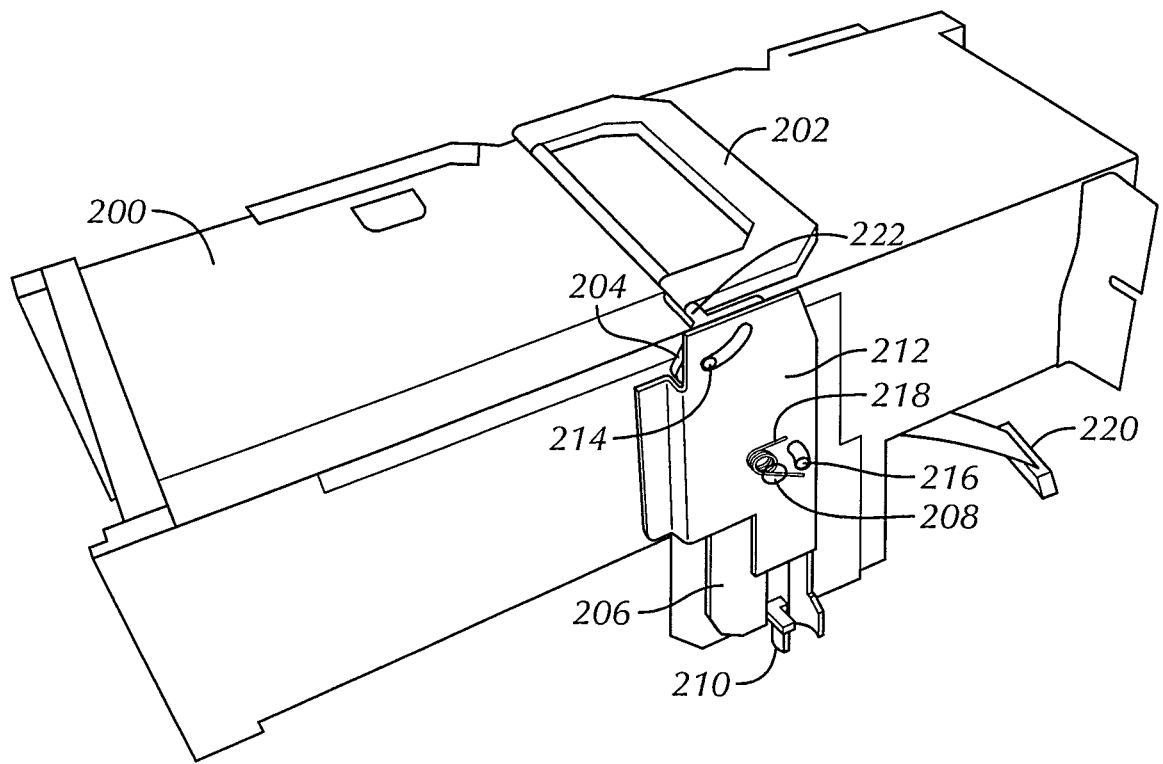
FIG. 2 shows a perspective view of a riser cage in accordance with one or more embodiments of the invention.

FIG. 2 shows a perspective view of a riser cage in accordance with one or more embodiments of the invention. The devices and/or components shown in FIG. 2 and described below are each only one example of a particular device and/or component. One having ordinary skill in the art, and the benefit of this Detailed Description, will appreciate that the techniques described herein may apply to any number of different devices. Accordingly, embodiments described herein should not be considered limited to devices shown in FIG. 2.

As shown in FIG. 2, the system includes a riser cage (200). The riser cage (200) may be an embodiment of the riser cage (112, FIG. 1) discussed above. The riser cage (200) may include a handle (202), a cam (204), a lever (206), a guiding feature (210), a lever housing feature (212), and connection cables (220). Each of these components is described below.

In one or more embodiments of the invention, the handle (202) is adapted to be coupled to an axis member (222). In one or more embodiments of the invention, the axis member (222) is a component, device, or structure that is adapted to be coupled to the top of the riser cage (200). The axis member (222) may be coupled to another side of the riser cage (200) without departing from the invention. The axis member (222) may further be adapted to rotate about an axis (not shown). The axis member (222) may rotate about the axis when the handle (202) and/or the cam (204) rotates. The axis member (222) may be implemented as, for example, one or more axles, hinge joints, etc. adapted to rotate about the axis. In one or more embodiments of the invention, the axis member (222) may be constructed of any material (e.g., polymer, metal, etc.) or any combination of materials. In one or more embodiments of the invention, the axis member (222) includes any number of other components (not shown) for providing a structure to which the handle (202) and the cam (204) are coupled, and that couples the axis member (222) to the riser cage (200). In one or more embodiments of the invention, the axis member (222) and its features are constructed as a single component. In other embodiments of the invention, the axis member (222) is any number of components coupled to form the axis member (222).

Returning to the discussion of the handle (202), the handle (202) may be further adapted to rotate the axis member (222) when a force is applied to the handle (202). The force may be applied by, for example, a hand of a user of the system. The force may be applied in a direction that causes the handle (202) to rotate from the first handle position to the second handle position. The handle (202) may rotate between the first handle position and the second handle position. The first handle position may refer to when the handle (202) is positioned significantly parallel (i.e., between zero and ten degrees) with the top of the riser cage (200). The second handle position may refer to when the handle (202) is significantly orthogonal (i.e., between 85 and 95 degrees) to the top of the riser cage (200). The handle (202) may be adapted to rotate past 95 degrees from the first handle position about the axis without departing from the invention. The handle (202) may be further adapted to be at least partially gripped by an average adult sized hand. Partially gripping the handle (202) may include at least partially wrapping at least one finger of a hand of a user around the handle (202) in such a way as to enable the hand to apply the force to rotate the handle (202) from the first handle position to the second handle position.

In one or more embodiments of the invention, the handle (202) may be constructed of any material (e.g., polymer, metal, etc.) or any combination of materials. In one or more embodiments of the invention, the handle (202) includes any number of other components (not shown) for providing a structure that couples the handle (202) to the axis member (222). In one or more embodiments of the invention, the handle (202) and its features are constructed as a single component. In other embodiments of the invention, the handle (202) is any number of components coupled to form the handle (202).

In one or more embodiments of the invention, the cam (204) is adapted to be coupled to the axis member (222). The cam (204) may be adapted to be coupled to axis member (222) such that the cam is positioned significantly parallel (i.e., between negative five and five degrees with respect to the side of the riser cage (200)) to the side of the riser cage (200). The cam (204) may be further adapted to rotate about the axis when the axis member (222) rotates as a result of the handle (202) rotating due to the force applied to the handle (202). In one or more embodiments of the invention, the cam (204) is further adapted to rotate the lever (206) (discussed below). In one embodiment, the cam (204) may be coupled to the lever (206) and rotate the lever (206) when the cam (204) rotates. In another embodiment, the cam (204) contacts the lever (206) and pushes the lever (206) when the cam (204) rotates causing the lever (206) to rotate. The cam (204) may be adapted to rotate between a first cam position and a second cam position. The first cam position may refer to the position of the cam (204) when the handle (202) is positioned in the first handle position. The second cam position may refer to the position of the cam (204) when the handle (202) is positioned in the second handle position (i.e., between 85 to 95 degrees from the first cam position). The cam (202) may be adapted to rotate about the axis past the second cam position without departing from the invention.

In one or more embodiments of the invention, the cam (204) may be constructed of any material (e.g., polymer, metal, etc.) or any combination of materials. In one or more embodiments of the invention, the cam (204) includes any number of other components (not shown) for providing a structure that couples the cam (204) to the axis member (222), and couples the cam (204) to the lever (206). In one or more embodiments of the invention, the cam (204) and its features are constructed as a single component. In other embodiments of the invention, the cam (204) is any number of components coupled to form the cam (204).

In one or more embodiments of the invention, the lever (206) is adapted to be coupled to the side of the riser cage (200). The lever (206) may further be adapted to be coupled to, or contact with, the cam (204). The lever (206) may be adapted to be significantly parallel (i.e., between negative five and five degrees with respect to the side of the riser cage (200)) to the side of the riser cage (200). The lever (206) may be further adapted to engage a stabilizing feature (not shown, discussed below). The lever (206) may be further adapted to rotate about a pivot point (208) when the cam (204) rotates as a result of the axis member (222) and handle (202) rotating due to the force applied to the handle (202).

In one or more embodiments of the invention, the pivot point (208) is a structure, device, or component that is adapted to provide the axis of rotation for the lever (206). The pivot point (208) may be coupled to the lever (206). The pivot point (208) may couple the lever (206) to the side of the riser cage (200). The pivot point (208) may be implemented as, for example, a pin, an axle, a screw, a bolt, or any other structure, device, or component adapted to provide the axis about which the lever (206) rotates. In one or more embodiments of the invention, the pivot point (208) may be constructed of any material (e.g., polymer, metal, etc.) or any combination of materials. In one or more embodiments of the invention, the pivot point (208) includes any number of other components (not shown) for providing a structure to which the lever (206) is coupled, and that couples the pivot point (208) to the side of the riser cage (200). In one or more embodiments of the invention, the pivot point (208) is a component of the lever housing feature (212) (discussed below). In one or more embodiments of the invention, the pivot point (208) and its features are constructed as a single component. In other embodiments of the invention, the pivot point (208) is any number of components coupled to form the pivot point (208).

Returning to the discussion of the lever (206), the lever (206) may be adapted to rotate between a first lever position and a second lever position. The first lever position may refer to the position of the lever (206) when the handle (202) is positioned in the first handle position and the cam (204) is positioned in the first cam position. The second lever position may refer to the position of the lever (206) when the handle (202) is positioned in the second handle position and the cam (204) is positioned in the second cam position. In one or more embodiments of the invention, when the lever (206) is in the first lever position, the lever engages with the stabilizing feature. In one or more embodiments of the invention, when the lever (206) is in the second lever position, the lever does not engage with the stabilizing feature. The lever (206) may disengage and engage with the stabilizing feature at any point between the first lever position and the second lever position without departing from the invention.

In one or more embodiments of the invention, the lever (206) may be constructed of any material (e.g., polymer, metal, etc.) or any combination of materials. In one or more embodiments of the invention, the lever (206) includes any number of other components (not shown) for providing a structure that couples the lever (206) to the cam (204) to the axis member (222), and engages the lever (206) with the stabilizing feature (e.g., the lever stabilizing component (discussed below)). In one or more embodiments of the invention, the lever (206) and its features are constructed as a single component. In other embodiments of the invention, the lever (206) is any number of components coupled to form the lever (206).

In one or more embodiments of the invention, the guiding feature (210) is a structure, device, or component adapted to be coupled to the side of the riser cage (200). The guiding feature (210) may further be adapted to position the riser cage (200) in a particular orientation relative to the computing device (e.g., 100, FIG. 1) so that the lever (206) may engage with the stabilizing feature. The guiding feature (210) may position the riser cage (200) in the particular orientation by interfacing with or otherwise contacting the stabilizing feature and/or the computing device. As an example, in an embodiment of the invention in which the stabilizing feature (discussed below) is an exposed bolt on the computing device, the guiding feature (210) may fit over and/or around the exposed bolt on the computing device to position the riser cage (200) in an orientation where the lever (206) may engage with the bolt.

In one or more embodiments of the invention, the guiding feature (210) may be constructed of any material (e.g., polymer, metal, etc.) or any combination of materials. In one or more embodiments of the invention, the guiding feature (210) includes any number of other components (not shown) for providing a structure that couples with the side of the riser cage (200), and contacts with and/or interfaces with the stabilizing feature. In one or more embodiments of the invention, the guiding feature (210) and its features are constructed as a single component. In other embodiments of the invention, the guiding feature (210) is any number of components coupled to form the guiding feature (210).

In one or more embodiments of the invention, the lever housing feature (212) is a structure adapted to be coupled to the side of the riser cage (200). The lever housing feature (212) may be further adapted to cover at least a portion of the lever (206) and a portion of the cam (204). The lever housing feature (212) may include the pivot point (208) as discussed above. In one or more embodiments of the invention, the lever housing feature (212) may be constructed of any material (e.g., polymer, metal, etc.) or any combination of materials. In one or more embodiments of the invention, the lever housing feature (212) includes any number of other components (not shown) for providing a structure that couples with the side of the riser cage (200). In one or more embodiments of the invention, the lever housing feature (212) and its features are constructed as a single component. In other embodiments of the invention, the lever housing feature (212) is any number of components coupled to form the lever housing feature (212).

The lever housing feature (212) may also be adapted to include the first constraining feature (214) and the second constraining feature (216). Each of these components is discussed below.

In one or more embodiments of the invention, the first constraining feature (214) is adapted to constrain the rotation of the cam (204) between the first cam position and the second cam position. The first constraining feature (214) may include, for example, a cutaway of the lever housing feature (212). The cam (204) may include a constraining component (e.g., a pin) (not shown) coupled to the cam (204) that interfaces with the cutaway. The cutaway may be a hole with two ends in the lever housing feature (212) shaped in such a way that enables the constraining component to slide or otherwise move along the cutaway as the cam (204) rotates. The constraining component may contact the ends of the cutaway, thus preventing the cam (204) from rotating further. When the constraining component contacts a first end of the cutaway, the cam (204) may be in the first cam position. When the constraining component contacts the second end of the cutaway, the cam (204) may be in the second cam position. In another embodiment of the invention, the cutaway may enable the cam (204) to rotate past the second cam position.

Accordingly, due to the cam (204) being coupled with and/or contacting the lever (206), the first constraining feature (214) may also constrain the rotation of the lever (206) between the first lever position and the second lever position. Likewise, due to the cam (204) being coupled with the axis member (222) and, therefore, the handle (202), the first constraining feature (214) may also constrain the rotation of the handle (202) between the first handle position and the second handle position.

In one or more embodiments of the invention, the second constraining feature (216) is a structure, component, or a device adapted to be coupled to the lever (206). In one or more embodiments of the invention, the second constraining feature (216) is further adapted to apply a counter force to the lever (206). The counter force, which when applied to the lever (206), may rotate the lever (206) to the first lever position. Accordingly, due to the lever being coupled to and/or contacting the cam (204), the counter force may also rotate the cam (204) to the first cam position. Likewise, due to the cam (204) being coupled to the axis member (222) and, therefore, the handle (202), the counter force may rotate the handle to the first handle position. The lever (206) may remain in the first lever position, the cam (204) may remain in the first cam position, and the handle (202) may remain in the first handle position until the force applied to the handle (202) overcomes the counter force acting on lever (206). When the force acting on the handle (202) overcomes the counter force, the handle (202) may rotate to the second handle position, the cam (204) may rotate to the second cam position, and the lever (206) may rotate to the second lever position. The counter force may be such that an average adult human may apply the force to overcome the counter force.

In one or more embodiments of the invention, the second constraining feature (216) includes a torsion spring (218) (covered by the lever housing feature (212)). The torsion spring (218) may be adapted to provide the counter force on the lever (206). The second constraining feature (216) may include other and/or additional components that apply the counter force without departing from the invention (e.g., a compression spring). In one or more embodiments of the invention, the second constraining feature (216) may be constructed of any material (e.g., polymer, metal, etc.) or any combination of materials. In one or more embodiments of the invention, the second constraining feature (216) may be constructed of any material (e.g., polymer, metal, etc.) or any combination of materials. In one or more embodiments of the invention, the second constraining feature (216) includes any number of other components (not shown) for providing a structure that couples with the torsion spring (218) to the lever (206). In one or more embodiments of the invention, the second constraining feature (216) and its features or components are constructed as a single component. In other embodiments of the invention, the second constraining feature (216) is any number of components coupled to form the second constraining feature (216).

In one or more embodiments of the invention, the connection cables (220) are adapted to be coupled to one or more components included in the riser cage (200). The connection cables (220) may be used to couple the components included in the riser cage (200) with the computing device. The connection cables (220) may be connected to any type of connection interface of the computing device without departing from the invention. The connection cables (220) may be used to connect the components in the riser cage (200) with other components of the computing device. Data may be transferred between the components included in the riser cage (200) and other components of the computing device using the connection cables (220). The connection cables (220) may include any type of cable used to connect components to the computing device or other components of the computing device without departing from the invention. The connection cables may include, for example, SATA cables, PCI-e cables, etc.

While FIG. 2 shows a configuration of components, other configurations may be used without departing from the scope of embodiments described herein. For example, while FIG. 2 shows a cam, lever, lever housing feature, and a guiding feature on one side of the riser cage, there may be a second cam, a second lever, a second lever housing feature, and a second guiding feature on another side of the riser cage. As another example, the riser cage and any of its components may each be of any shape and/or size. Accordingly, embodiments disclosed herein should not be limited to the configuration of components shown in FIG. 2.

Figure 3:
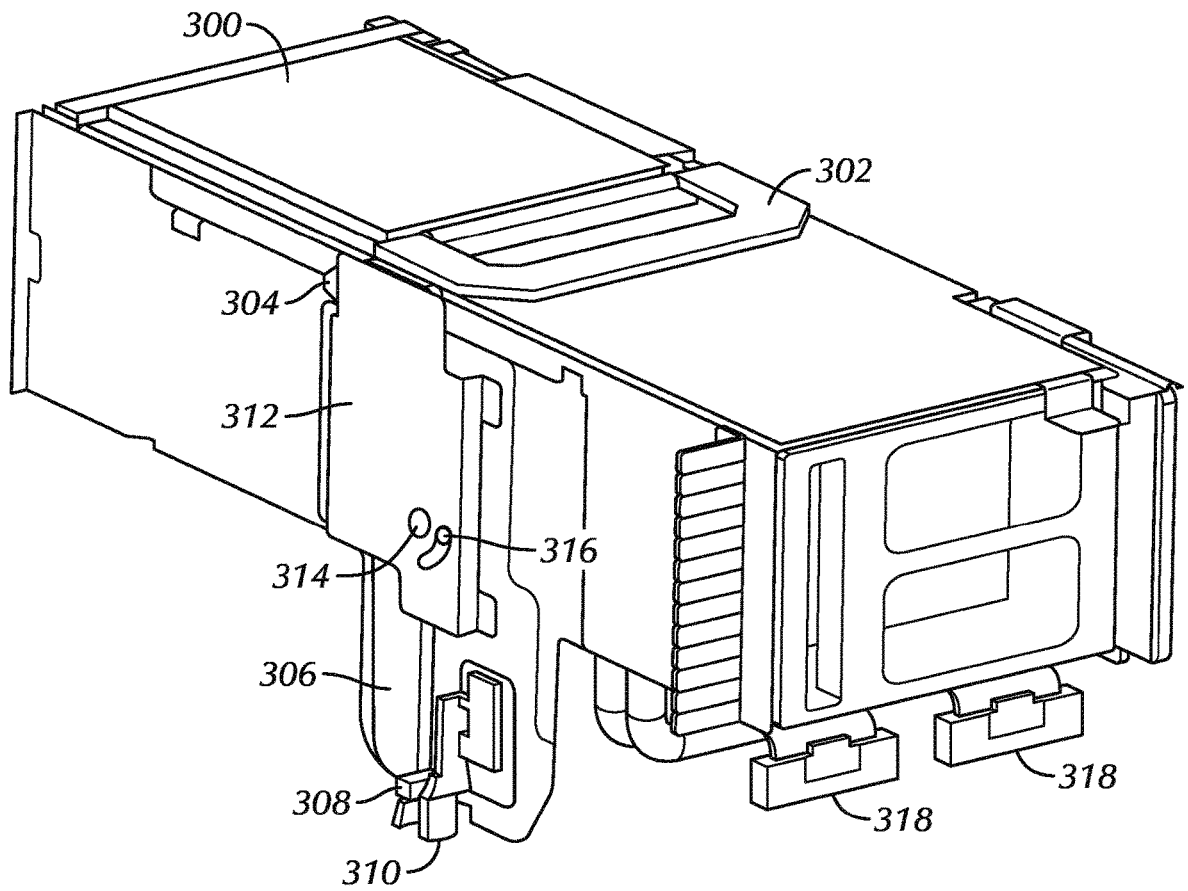
FIG. 3 shows a second perspective view of a riser cage in accordance with one or more embodiments of the invention.

FIG. 3 shows a second perspective view of a riser cage in accordance with one or more embodiments of the invention. The devices/components shown in FIG. 3 and described below are each only one example of a particular device/component. One having ordinary skill in the art, and the benefit of this Detailed Description, will appreciate that the techniques described herein may apply to any number of different devices. Accordingly, embodiments described herein should not be considered limited to devices shown in FIG. 3.

As shown in FIG. 3, the system includes a riser cage (300). In one or more embodiments of the invention the riser cage (300) may be an embodiment of the riser cage discussed above in FIGS. 1-2. The riser cage (300) may include a handle (302), a cam (304), a lever (306), a guiding feature (310), a lever housing feature (312), and connection cables (318). Each of these components is described below.

In one or more embodiments of the invention, the riser cage (300), the handle (302), the cam (304), the lever (306), the guiding feature (310), the lever housing feature (312), and the connection cables (318) are substantially similar to the riser cage, the handle, the cam, the lever, the guiding feature, the lever housing feature, and the connection cables discussed above in the description of FIG. 2.

The lever housing feature (312) may include a pivot point (314) and a second constraining feature (316). In one or more embodiments of the invention, the pivot point (314) and the second constraining feature (316) are substantially similar to the pivot point and the second constraining feature discussed above in the description of FIG. 2. The lever housing feature (312) may also include a first constraining feature (not shown in FIG. 3). In one or more embodiments of the invention, the first constraining feature may be substantially similar to the first constraining feature discussed above in the description of FIG. 2.

In one or more embodiments of the invention, the lever (306) includes a lever stabilizing component (308). In one or more embodiments of the invention, the lever stabilizing component (308) is adapted to be coupled to the lever (306). The lever stabilizing component (308) may be further adapted to engage with the stabilizing feature (discussed below). To engage with the stabilizing feature, the lever stabilizing component (308) may interface with and/or otherwise contact at least a portion of the stabilizing feature. When the lever stabilizing component (308) is engaged with the stabilizing feature, the riser cage (300) is locked to the computing device. The lever stabilizing component (308) may engage with the stabilizing feature when the lever (306) is in the first lever position. The lever stabilizing component (308) may be disengaged with the stabilizing feature when the lever (306) is in the second lever position. When the lever stabilizing component (308) is disengaged with the stabilizing feature, the riser cage (300) may be unlocked from the computing device.

In one or more embodiments of the invention, the lever stabilizing component (308) may be constructed of any material (e.g., polymer, metal, etc.) or any combination of materials. In one or more embodiments of the invention, the lever stabilizing component (308) includes any number of other components (not shown) for providing a structure that couples with the lever (306) and interfaces with and/or otherwise contacts the stabilizing feature. In one or more embodiments of the invention, the lever stabilizing component (308) and its features or components are constructed as a single component included with the lever (306). In other embodiments of the invention, the lever stabilizing component (308) is any number of components coupled to form the lever stabilizing component (308).

As an example, in a scenario in which the stabilizing feature includes an stabilizing post (e.g., an exposed bolt) on the computing device, the lever stabilizing component (308) may interface with the head and shaft of the exposed bolt. The lever stabilizing component (308) may engage the exposed bolt by contacting the shaft and the bottom surface of the head of the bolt. When engaged with the bolt, the lever stabilizing component (308) may prevent any upward movement necessary to lift the riser cage (300) from the computing device due to the lever stabilizing component (308) contacting the bottom surface of the head of the bolt. Also when engaged with the bolt, the lever stabilizing component (308) may prevent at least some horizontal movement due to the lever stabilizing component (308) contacting the shaft of the bolt. When the lever stabilizing component is disengaged with the bolt, the riser cage (300) is able to be lifted from the computing device.

While FIG. 3 shows a configuration of components, other configurations may be used without departing from the scope of embodiments described herein. While FIG. 3 shows a cam, lever, lever stabilizing component, lever housing feature, and a guiding feature on one side of the riser cage, there may be a second cam, a second lever, a second lever housing feature, and a second guiding feature on another side of the riser cage. As another example, the riser cage and any of its components may each be of any shape and/or size. As still a further example, the components of the riser cage may be located anywhere on the riser cage. Accordingly, embodiments disclosed herein should not be limited to the configuration of components shown in FIG. 3.

Figure 4:
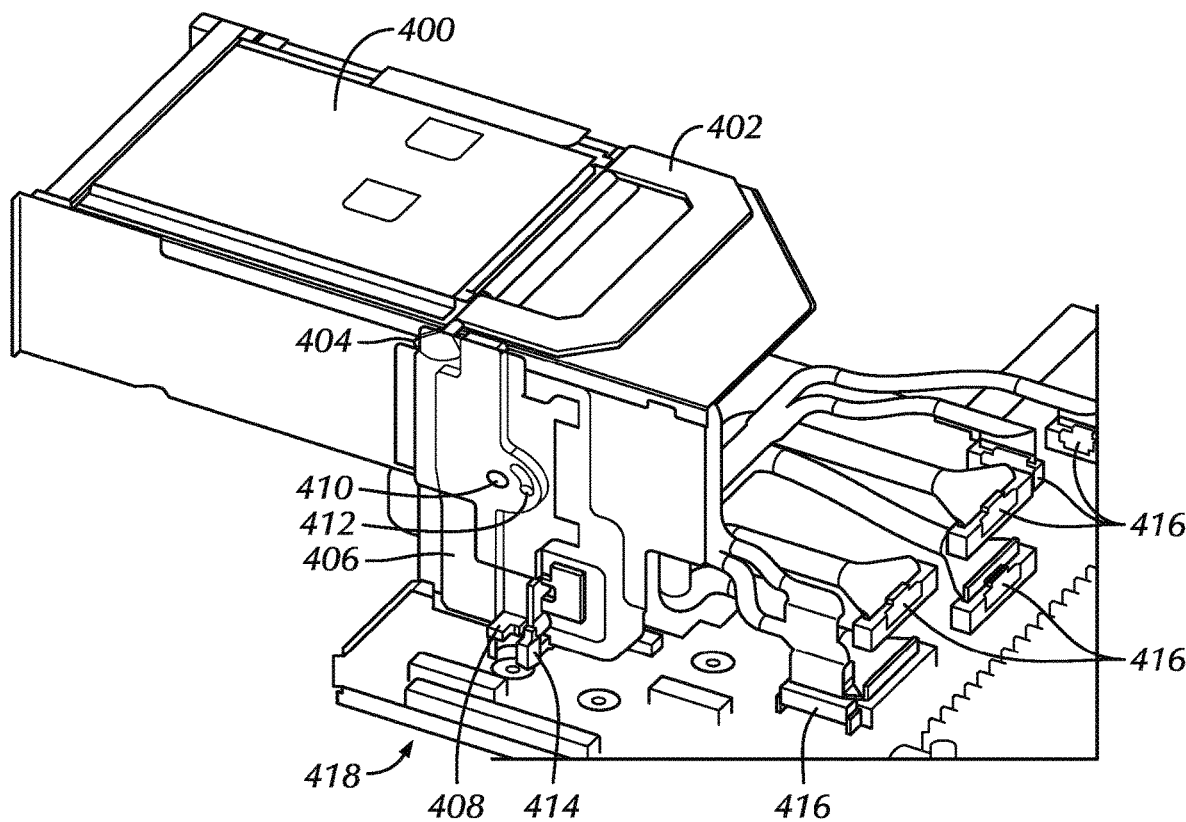
FIG. 4 shows a perspective view of a riser cage connected to a computing device in accordance with one or more embodiments of the invention.

FIG. 4 shows a perspective view of a riser cage connected to a computing device in accordance with one or more embodiments of the invention. The devices/components shown in FIG. 4 and described below are each only one example of a particular device/component. One having ordinary skill in the art, and the benefit of this Detailed Description, will appreciate that the techniques described herein may apply to any number of different devices. Accordingly, embodiments described herein should not be considered limited to devices shown in FIG. 4.

As shown in FIG. 4, the system includes a riser cage (400). In one or more embodiments of the invention the riser cage (400) may be an embodiment of the riser cage discussed above in FIGS. 1-3. The riser cage (400) may include a handle (402), a cam (404), a lever (406), a lever stabilizing component (408), a pivot point (410), a second constraining feature (412), a guiding feature (414), connection cables (416), and a computing device (418). Each of these components is described below.

In one or more embodiments of the invention, the riser cage (400), the handle (402), the cam (404), the lever (406), the lever stabilizing component (408), the pivot point (410), the second constraining feature (412), the guiding feature (414), and the connection cables (416) are substantially similar to the riser cage, the handle, the cam, the lever, the lever stabilizing component, the pivot point, the second constraining feature, the guiding feature, and the connection cables discussed above in the description of FIGS. 2-3.

In one or more embodiments of the invention, the riser cage (400) includes a lever housing feature (not shown in FIG. 4) and a first constraining feature (not shown in FIG. 4). In one or more embodiments of the invention, the lever housing feature and the first constraining feature are substantially similar to the lever housing feature and the first constraining feature discussed above in the descriptions of FIGS. 2-3.

In one or more embodiments of the invention, the computing device (418) is substantially similar to the computing device discussed above in FIG. 1. The riser cage (400) may be connected to all, or a portion (e.g., a motherboard, server chassis, PC case, etc.), of the computing device (418) without departing from the invention.

While FIG. 4 shows a configuration of components, other configurations may be used without departing from the scope of embodiments described herein. While FIG. 4 shows a cam, lever, lever stabilizing component, lever housing feature, and a guiding feature on one side of the riser cage, there may be a second cam, a second lever, a second lever housing feature, and a second guiding feature on another side of the riser cage. As another example, the riser cage and any of its components may each be of any shape and/or size. As still a further example, the components of the riser cage may be located anywhere on the riser cage and the riser cage may be connected to any portion of the computing device. Accordingly, embodiments disclosed herein should not be limited to the configuration of components shown in FIG. 4.

Figure 5:
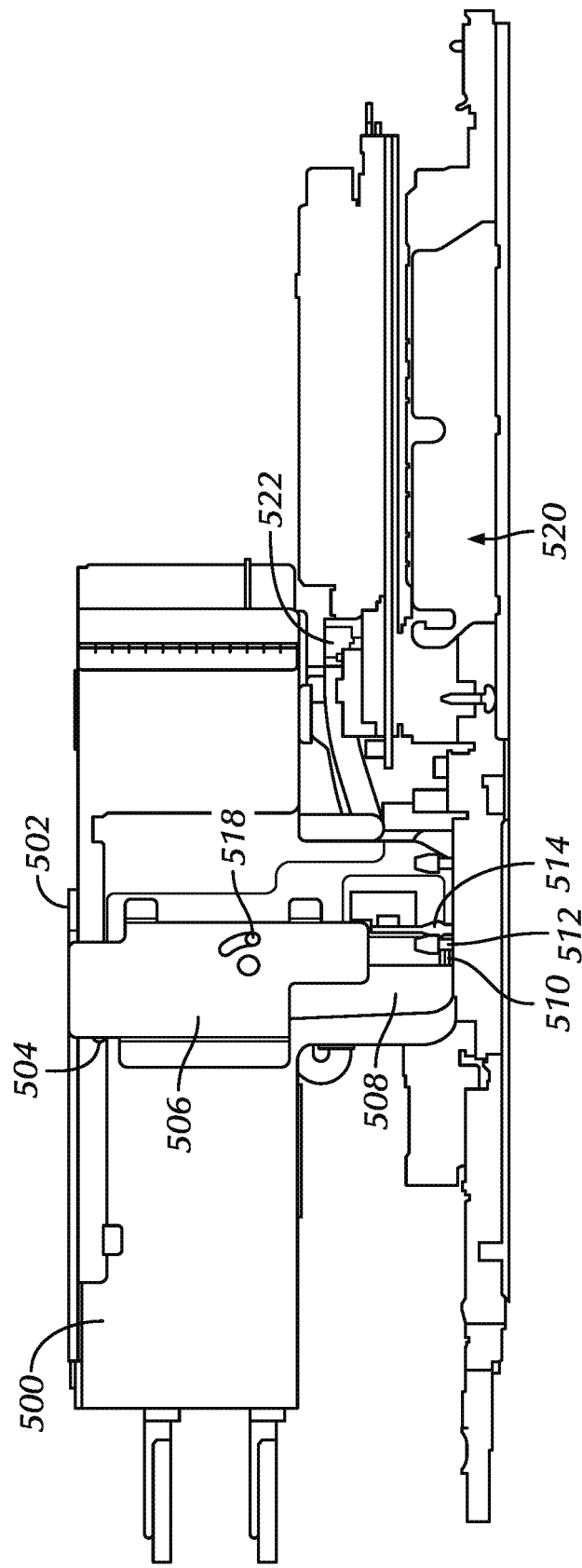
FIG. 5 shows a side view of a riser cage connected to a computing device in accordance with one or more embodiments of the invention.

FIG. 5 shows a side view of a riser cage connected to a computing device in accordance with one or more embodiments of the invention. The devices/components shown in FIG. 5 and described below are each only one example of a particular device/component. One having ordinary skill in the art, and the benefit of this Detailed Description, will appreciate that the techniques described herein may apply to any number of different devices. Accordingly, embodiments described herein should not be considered limited to devices shown in FIG. 5.

As shown in FIG. 5, the system includes a riser cage (500). In one or more embodiments of the invention the riser cage (500) may be an embodiment of the riser cage discussed above in FIGS. 1-4. The riser cage (500) may include a handle (502), a cam (504), a lever housing feature (506), a lever (508), a lever stabilizing component (510), a stabilizing feature (512), a guiding feature (514), a second constraining feature (518), connection cables (522), and a computing device (520). Each of these components is described below.

In one or more embodiments of the invention, the riser cage (500), the handle (502), lever housing feature (506), the lever (508), the lever stabilizing component (510), the guiding feature (514), the second constraining feature (518), the connection cables (522), and the computing device (520) are substantially similar to the riser cage, the handle, the cam, lever housing feature, the lever, the lever stabilizing component, the guiding feature, the second constraining feature, the connection cables, and the computing device discussed above in the description of FIGS. 2-4.

In one or more embodiments of the invention, the riser cage (500) includes a pivot point (not shown in FIG. 5) and a first constraining feature (not shown in FIG. 5). In one or more embodiments of the invention, the pivot point and the first constraining feature are substantially similar to the pivot point and the first constraining feature discussed above in the descriptions of FIGS. 2-4.

In one or more embodiments of the invention, the stabilizing feature (512) is a structure, component or device adapted to be coupled to the side of the computing device (520). The stabilizing feature (512) may be further adapted to be engaged by the lever stabilizing component (510) of the lever (508). To be engaged by the lever stabilizing component (510), the stabilizing feature (512) may interface with and/or otherwise contact the lever stabilizing component (510). When the lever stabilizing component (510) is engaged with the stabilizing feature (512), at least a portion of the stabilizing feature interfaces with and/or otherwise contacts with the lever stabilizing component (510). Such interfacing and/or contacting between the stabilizing feature (512) and the lever stabilizing component may prevent upward movement of the riser cage (500) (i.e., the movement required to remove the riser cage (500) from the computing device (520)) and at least a portion of horizontal movement of the riser cage (500). The stabilizing feature (512) may be implemented as, for example, a bolt, a screw, a post, a wall, or any other type of device, structure, or component that may be used to engage with the lever stabilizing component (510).

In one or more embodiments of the invention, the stabilizing feature (512) may be constructed of any material (e.g., polymer, metal, etc.) or any combination of materials. In one or more embodiments of the invention, the stabilizing feature (512) includes any number of other components (not shown) for providing a structure that interface and/or otherwise contact with the side of the lever stabilizing component (510). In one or more embodiments of the invention, the stabilizing feature (512) and its features are constructed as a single component. In other embodiments of the invention, the stabilizing feature (512) is any number of components coupled to form the stabilizing feature (512).

While FIG. 5 shows a configuration of components, other configurations may be used without departing from the scope of embodiments described herein. While FIG. 5 shows a cam, lever, lever stabilizing component, lever housing feature, a guiding feature, and a stabilizing feature on one side of the riser cage, there may be a second cam, a second lever, a second lever housing feature, a second guiding feature, and a second stabilizing feature on another side of the riser cage. As another example, the riser cage and any of its components may each be of any shape and/or size. As still a further example, the components of the riser cage may be located anywhere on the riser cage and the riser cage may be connected to any portion of the computing device. Accordingly, embodiments disclosed herein should not be limited to the configuration of components shown in FIG. 5.

FIG. 6.1 shows a perspective view of a first example of a riser cage connected to a computing device in accordance with one or more embodiments of the invention. The first example is for explanatory purposes only and is not intended to limit the invention. The first example may include fewer components than those shown in FIGS. 1-5 for the sake of brevity. The first example depicts a riser cage in accordance with one or more embodiments of the invention at a first point in time.

EXAMPLES

The first example is intended to be a simple example to illustrate, at least in part, embodiments of the invention described herein.

Turning to FIG. 6.1, consider a scenario in which a riser cage (600) is locked to a computing device (622). The riser cage (600) includes a handle in the first handle position (602). No force has been applied to the handle to overcome a counter force acting on the handle through the lever by a second constraining feature (614). As a result the, handle may stay in the first handle position until such a force acts upon the handle. Accordingly, the cam is in the first cam position (604) and the lever is in the first lever position (610). The aforementioned second constraining feature applies the counter force to the lever, which rotates the cam to the first cam position and rotates the handle to the first handle position. The riser cage (600) also includes a lever housing feature (608).

The lever housing feature (608) includes the first constraining feature (606) which limits the rotation of the cam and the handle about the axis and further limits the rotation of the lever about a pivot point (612). The pivot point (612) is provided by a bolt coupled to the lever housing feature (608) and the side of the riser cage (600). The lever housing feature (608) further includes the second constraining feature which provides the counter force as is discussed above. The riser cage (600) further includes a guiding feature (620) interfacing with a stabilizing feature (618). The stabilizing feature (618) is implemented as a bolt coupled to the computing device (622).

Due to the handle in the first handle position (602), the cam in the first cam position (604) and the lever in the first lever position (610), the lever stabilizing component (616) of the lever is engaged with the stabilizing feature (618). A portion of the top surface of the lever stabilizing component (616) contacts the bottom surface of the head of the stabilizing feature (618). Therefore, the riser cage (600) is locked to the computing device (622). In other words, the riser cage (600) may not be lifted to remove the riser cage (600) from the computing device (622).

FIG. 6.2 shows a perspective view of a second example of a riser cage connected to a computing device in accordance with one or more embodiments of the invention. The second example is for explanatory purposes only and is not intended to limit the invention. The second example may include fewer components than those shown in FIGS. 1-5 for the sake of brevity. The second example depicts a riser cage in accordance with one or more embodiments of the invention at a second point in time. The second example is intended to be a simple example to illustrate, at least in part, embodiments of the invention described herein.

Consider a scenario in which a riser cage (600) is unlocked from a computing device (622). The riser cage (600) includes a handle in the second handle position (602). A force has been applied to the handle to overcome a counter force acting on the handle through the lever by a second constraining feature (614). As a result the, handle was rotated to the second handle position. Accordingly, the cam is in the second cam position (604) and the lever is in the second lever position (610). The aforementioned force was applied by a single hand of a user of the system. The riser cage (600) also includes a lever housing feature (608).

The lever housing feature (608) includes the first constraining feature (606) which limits the rotation of the cam and the handle about the axis and further limits the rotation of the lever about a pivot point (612). The pivot point (612) is provided by a bolt coupled to the lever housing feature (608) and the side of the riser cage (600). The lever housing feature (608) further includes the second constraining feature which provides the counter force as is discussed above. The riser cage (600) further includes a guiding feature (620) interfacing with a stabilizing feature (618). The stabilizing feature (618) is implemented as a bolt coupled to the computing device (622).

Due to the handle in the second handle position (602), the cam in the second cam position (604) and the lever in the second lever position (610), the lever stabilizing component (616) of the lever is disengaged with the stabilizing feature (618). The lever stabilizing component (616) does not contact or interface with any portion of the stabilizing feature (618). Therefore, the riser cage (600) is unlocked from the computing device (622). In other words, the riser cage (600) may be lifted to remove the riser cage (600) from the computing device (622).

END OF EXAMPLES

In the above description, numerous details are set forth as examples of embodiments described herein. It will be understood by those skilled in the art, and having the benefit of this Detailed Description, that one or more embodiments of embodiments described herein may be practiced without these specific details and that numerous variations or modifications may be possible without departing from the scope of the embodiments described herein. Certain details known to those of ordinary skill in the art may be omitted to avoid obscuring the description.

In the above description of the figures, any component described with regard to a figure, in various embodiments described herein, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named or similarly numbered components. Additionally, in accordance with various embodiments described herein, any description of the components of a figure is to be interpreted as an optional embodiment, which may be implemented in addition to, in conjunction with, or in place of the embodiments described with regard to a corresponding like-named or similarly numbered component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information may travel may be considered an operative connection.

As used herein, words that express a certain direction (e.g., forward, reverse, front, back, rear, etc.) are not intended to express that a component of a riser cage is coupled to particular side of component. Instead, such terms are intended to convey a side of the component relative to other components in a given figure, and/or to describe components that may be located on different sides of another component (e.g., top versus side).

As used herein, the phrase coupled to means that two or more component are coupled using any form of direct and/or indirect coupling between two or more components without departing from the invention.

While a limited number of embodiments have been described herein, those skilled in the art, having benefit of this disclosure, will appreciate that other embodiments can be devised which do not depart from the scope of the embodiments described herein. Accordingly, the scope of embodiments described herein should be limited only by the attached claims.

What is claimed is:

1. A system, comprising:
a riser cage in a computing device, wherein:
the riser cage comprises a component of the computing device, and
the component is adapted to be coupled to the computing device via a connection cable;
an axis member coupled to a first side of the riser cage and adapted to rotate about an axis;
a handle coupled to the axis member and adapted to rotate the axis member about the axis;
a cam, coupled to the axis member, and adapted to rotate about the axis when the axis member rotates; and
a lever coupled to a second side of the riser cage and adapted to rotate about a pivot point when the cam rotates, wherein:
the lever contacts the cam on a first end of the lever;
the cam pushes the lever when the cam rotates causing the lever to rotate;
the lever engages a lever stabilizing component with a stabilizing feature when the handle is in a first handle position,
the lever stabilizing component is positioned on a second end of the lever,
the stabilizing feature is coupled to the computing device,
the riser cage is securely attached to the computing device when the lever engages with the stabilizing feature,
the lever is further adapted to disengage with the stabilizing feature when the handle is rotated to a second handle position,
the first handle position comprises the handle positioned between 0 and 10 degrees relative to the first side of the riser cage,
the second handle position comprises the handle positioned between 85 and 95 degrees relative to the first side of the riser cage, and
the handle, when in the second handle position and the lever is disengaged from the stabilizing feature, is further adapted to enable a user to hold the riser cage with a first hand of the user and disconnect the connection cable with a second hand of the user;
a lever housing feature coupled to the second side of the riser cage, the lever housing feature comprising:
the pivot point about which the lever rotates;
a first constraining feature coupled to the cam and constrains rotation of the cam between a first cam position and a second cam position; and
a second constraining feature coupled to the lever comprising a torsion spring wherein:
the torsion spring and the second constraining feature applies a counter force to the lever;
the lever remains in a first lever position unless a force greater than the counter force is applied to the lever by the cam;
the force is applied as a result of rotation of the axis member when the handle moves from the first handle position to the second handle position; and
when the force applied to the lever by the cam is greater than the counter force, the lever rotates to a second lever position
when the force is removed, the counter force rotates the lever back to the first lever position.

2. The system of claim 1, wherein the stabilizing feature comprises a stabilizing post.

3. The system of claim 1, wherein the riser cage is configured to be free to release from the computing device when the handle is in the second handle position and the connection cable disconnected.

4. The system of claim 1, wherein the lever housing feature at least partially covers the lever and the cam.

5. The system of claim 4, wherein:
the first cam position corresponds to the first handle position;
the first cam position corresponds to the first lever position;
the second cam position corresponds to the second handle position; and
the second cam position corresponds to the second lever position.

6. The system of claim 1, wherein the system further comprises a guiding feature coupled to the second side of the riser cage.

7. The system of claim 6, wherein the guiding feature is adapted to position the riser cage in an orientation of the riser cage relative to the computing device.

8. The system of claim 7, wherein positioning the riser cage in the orientation enables the lever to engage with the stabilizing feature.

9. The system of claim 5, wherein the force is applied as a result of rotating of the axis member when the handle moves from the first handle position to the second handle position.

10. The system of claim 5, wherein when the counter force rotates the lever back to the first lever position, the counter force rotates the cam to the first cam position and the handle to the first handle position.

* * * * *